(12) United States Patent
Takamatsu et al.

(10) Patent No.: US 6,767,402 B2
(45) Date of Patent: Jul. 27, 2004

(54) METHOD FOR VAPORIZING AND SUPPLYING

(75) Inventors: Yukichi Takamatsu, Kanagawa (JP); Takeo Yoneyama, Kanagawa (JP); Mitsuhiro Iwata, Kanagawa (JP); Koji Kiriyama, Kanagawa (JP); Kiichirou Araya, Kanagawa (JP)

(73) Assignee: Japan Pionics Co., Ltd., Tokyo (JP)

( * ) Notice: Subject to any disclaimer, the term of this patent is extended or adjusted under 35 U.S.C. 154(b) by 13 days.

(21) Appl. No.: 10/225,196

(22) Filed: Aug. 22, 2002

(65) Prior Publication Data

US 2003/0111007 A1 Jun. 19, 2003

(30) Foreign Application Priority Data

Sep. 4, 2001 (JP) .......................................... 2001-266669
Feb. 21, 2002 (JP) .......................................... 2002-044173

(51) Int. Cl.[7] .......................... C30B 25/02; C30B 25/04
(52) U.S. Cl. ........................... 117/86; 117/89; 117/102; 117/104
(58) Field of Search .............................. 117/86, 89, 102, 117/104; 427/248.1

(56) References Cited

U.S. PATENT DOCUMENTS

| 5,460,654 | A | | 10/1995 | Kikkawa et al. |
| 5,968,588 | A | * | 10/1999 | Sivaramakrishnan et al. .. 427/8 |
| 6,126,725 | A | * | 10/2000 | Tateyama ........................ 96/6 |
| 6,162,734 | A | | 12/2000 | Bergman et al. |
| 2001/0002573 | A1 | | 6/2001 | Takamatsu et al. |

FOREIGN PATENT DOCUMENTS

| EP | 0 299 522 | 1/1989 |
| WO | WO 99/55466 | 11/1999 |

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

A vaporizing and supplying method for controlling a liquid CVD material in flow rate with liquid flow rate controllers, supplying a vaporizer with the material, vaporizing the same, and supplying a semiconductor manufacturing apparatus with the vaporized material, which includes installing in parallel, a plurality of liquid flow rate controllers, preferably each having a different controllable range of flow rate, and supplying the vaporizer with the material at a variable flow rate thereof by altering the single use of any of the controllers to the simultaneous use of a plurality thereof or vice versa, and/or switching any of the controllers one after another.

9 Claims, 1 Drawing Sheet

METHOD FOR VAPORIZING AND SUPPLYING

BACKGROUND OF THE INVENTION

1. Field of the Invention

The present invention relates to a vaporizing and supplying method intended for supplying a semiconductor manufacturing apparatus with a gaseous CVD (chemical vapor deposition) material. More particularly, the present invention pertains to a vaporizing and supplying method which is intended for supplying a semiconductor manufacturing apparatus with a liquid CVD material by controlling the flow rate of a liquid CVD material with an extremely high accuracy and vaporizing the liquid CVD material, and is also intended for enabling the production of a semiconductor thin film with an extremely high accuracy of film thickness.

2. Description of the Related Arts

Along with the development of semiconductor industries in recent years, there has been much progress in enhancement of performance and integration for a semiconductor device. Thus, a variety of organometal compounds in liquid form come to be used as materials for metallic films and insulation films to take the place of gaseous hydrides and halides that have heretofore been employed.

For instance, there are employed in metallic films for a semiconductor device, dimethyl aluminum hydride $\{(Al(CH_3)_2H\}$ as CVD materials of aluminum films; hexafluoroacetylacetone copper vinyl trimethylsilane $\{(CF_3CO)_2CHCu.CH_2CHSi(CH_3)_3\}$ as CVD materials of copper films; bis(ethylcyclopentadienyl)ruthenium $\{(Ru(C_5H_4C_2H_5)_2\}$ as CVD materials of ruthenium films; etc.

With regard to an insulated film for a semiconductor device, there are known $SiO_2$ as a gate insulating film, $Si_3N_4$ as a capacitor insulating film and PSG (phosphorus/silicon/glass) and BPSG (boron/phosphorus/silicon/glass) as an interlaminar insulating film. In addition, there are used tetraethoxysilicon $\{Si(OC_2H_5)_4\}$ as a CVD material for $SiO_2$ film, trimethoxyboron $\{B(OCH_3)_3\}$, trimethoxyphosphorus $\{P(OCH_3)_3\}$ and the like as a CVD materials for PSG and BPSG films.

On the other hand, as a method for vaporizing a liquid CVD material and supplying a semiconductor manufacturing apparatus with the resultant gaseous CVD material, there has been used a method in which a carrier gas is introduced in a liquid CVD material so as to vaporize part of the liquid CVD material, and the mixed gas of the carrier gas and the CVD material is subjected to flow rate control with a mass flow controller and is supplied to a semiconductor manufacturing apparatus. However, this method is difficult to stabilize vaporization conditions and produce a feed gas at a definite concentration and a flow rate. Accordingly, there is prevailingly employed at the present time, a method in which a liquid CVD material is subjected to flow rate control with a liquid flow controller, and supplied to a vaporizer, where it is vaporized, and the resultant gaseous CVD material is supplied to a semiconductor manufacturing apparatus.

As a method for subjecting a liquid CVD material to flow rate control, there are available a method in which an inert gas is pressurized into a liquid CVD material vessel, whereby the liquid CVD material is introduced into a liquid mass flow controller, and is subjected to flow rate control; and a method in which the flow rate of a liquid CVD material is controlled with a flow variable micropump. In any of the above-mentioned methods, a CVD material is supplied to a vaporizer after the flow rate thereof is measured in the state of liquid. Among the methods, there is generally carried out a vaporizing and supplying method using a liquid mass flow controller which is relatively easy in maintenance work.

A mass flow controller for general purpose used for the flow rate control of a liquid CVD material is constituted of a flow rate sensor, an electrical circuit, a control valve and the like. The flow rate sensor is of such a constitution that two self-heating type resistors wound on the outside of CVD material piping are incorporated in a bridge circuit, and is in such a state that the resistors are heated by a current flowing at all times. The bridge circuit is constituted so that voltage is generated when the balance of the self-heating type resistors is lost. The voltage of the bridge circuit which is caused by the heat transfer due to the flowing of a CVD material in piping is directly proportional to the mass flow rate of the CVD material, and accordingly the flow rate control of the CVD material with the mass flow controller is carried out, for instance, by measuring the flow rate of the CVD material through measurement of electric output, and thus controlling the flow rate to a prescribed level.

However, in the case of measuring the flow rate of liquid CVD material by means of the liquid mass flow controller, a large error exists between the true and measured values because of much difference in specific heat and volume per unit time each of the CVD material flowing inside the piping as compared with the measurement of the flow rate of a gaseous CVD material with a gas mass flow controller. Hence it has been impossible to produce a semiconductor thin film with a very high accuracy of film thickness. On the other hand, a method in which the flow rate is measured with flow variable micropump involves a large error on account of pulsation flow of the liquid CVD material.

SUMMARY OF THE INVENTION

In such circumstances, an object of the present invention is to provide a vaporizing and supplying method for subjecting a liquid CVD material to flow rate control with a liquid flow rate controller, supplying a vaporizer with the material, vaporizing the same, and supplying a semiconductor manufacturing apparatus with the vaporized material, characterized in that the method enables a semiconductor thin film to be manufactured with an extremely high accuracy, while controlling the flow rate of the liquid CVD material with a high accuracy.

Other objects of the present invention will become obvious from the text of this specification hereinafter disclosed.

Under such circumstances, intensive extensive research and development were accumulated by the present inventors in order to solve the above-described problems involved in the prior arts. As a result, the following has been found. Specifically, by installing in parallel, a plurality of liquid flow rate controllers, preferably at least two types of liquid flow rate controllers each having a different controllable range of flow rate and by using in combination so as to enable any of the aforesaid controllers to be used alone, or in plurality at the same time, or switchingly one after another, it is made possible to supply a vaporizer with the liquid CVD material in a wide range of capacity including a small to large capacity with a high accuracy, vaporize the material and supply a semiconductor manufacturing apparatus with the vaporized material. Thus, the present invention has been accomplished by the foregoing findings and information.

That is to say, the present invention is related to a vaporizing and supplying method for subjecting a liquid CVD material to flow rate control with a liquid flow rate controller, supplying a vaporizer with the material, vaporizing the same, and supplying a semiconductor manufacturing apparatus with the vaporized material, which comprises installing in parallel, a plurality of liquid flow rate controllers for the same type of liquid CVD material, and supplying the vaporizer with the material at a variable flow rate thereof by altering the single use of any of the controllers to simultaneous use of a plurality thereof or vice versa, and/or switching any of the controllers one after another.

DESCRIPTION OF THE PREFERRED EMBODIMENTS

Figure 1:
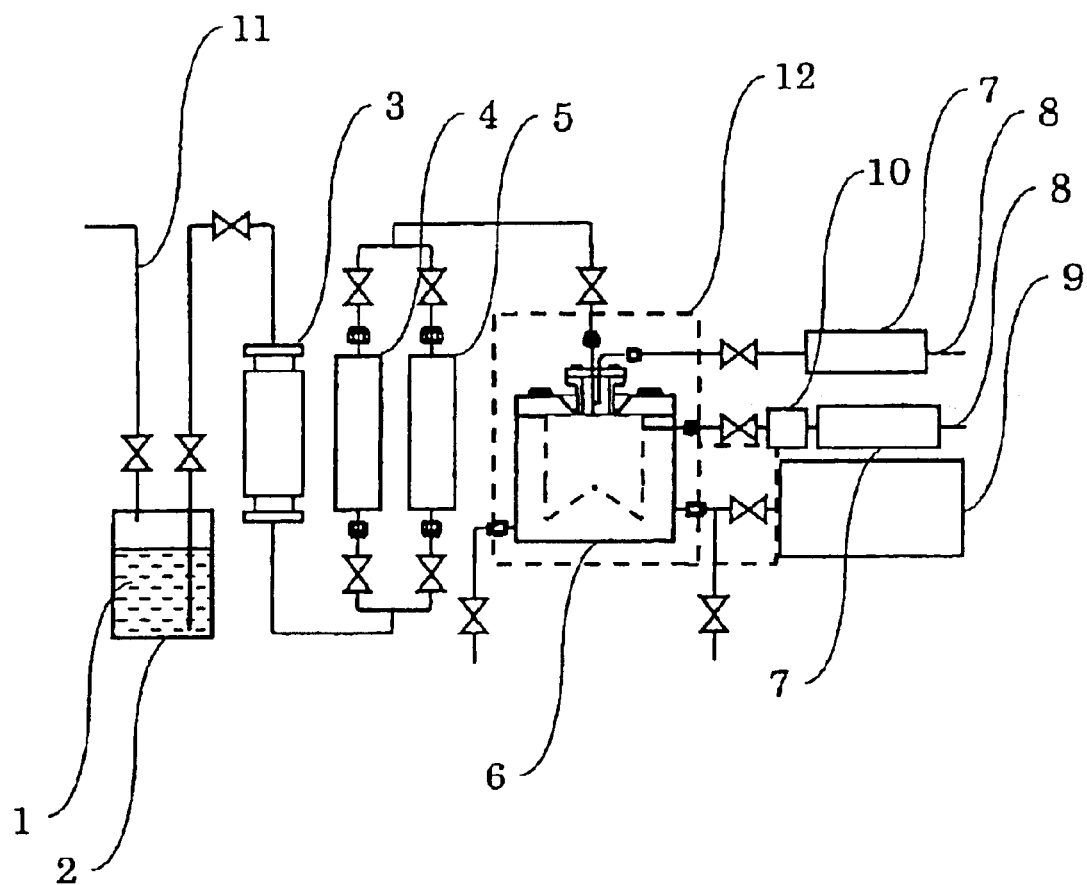
FIG. 1 is a constitutional view showing one example of a vaporizing and supplying system to carry out the vaporizing and supplying method according to the present invention.

The present invention is applied to a vaporizing and supplying method for subjecting a liquid CVD material to flow rate control with a liquid flow rate controller such as a liquid mass flow controller or a flow variable micropump, supplying a vaporizer with the material, vaporizing the same, and supplying a semiconductor manufacturing apparatus with the vaporized material.

The vaporizing and supplying method according to the present invention is the method which comprises installing in parallel, a plurality of liquid flow rate controllers for the same type liquid CVD material, preferably at least two types of liquid flow rate controllers each having different controllable range of flow rate so as to enable any of the controllers to be used alone, or in plurality at the same time, or switchingly one after another; controlling the flow rate thereof with the combination of the controllers; supplying a vaporizer with the liquid CVD material; vaporizing the material; and supplying a semiconductor manufacturing apparatus with vaporized material.

The CVD material applicable to the vaporizing and supplying method according to the present invention is not specifically limited, provided that the CVD material can be kept in liquid state whether it is in liquid state at ordinary temperature or a solution of a solid dissolved in a solvent. The CVD material is properly and optionally selected for use according to the purpose of use. Examples thereof include an alkoxide in liquid state at ordinary temperature such as tetraisopropoxytitanium (Ti(OCH(CH$_3$)$_2$)$_4$), tetra-n-propoxytitanium (Ti(OC$_3$H$_7$)$_4$), tetra-tert-butoxyzirconium (Zr(OC(CH$_3$)$_3$)$_4$), tetra-n-butoxyzirconium (Zr(OC$_4$H$_9$)$_4$), tetramethoxyvanadium (V(OCH$_3$)$_4$), trimethoxyvanadyl oxide (VO(OCH$_3$)$_3$), pentaethoxyniobium (Nb(OC$_2$H$_5$)$_5$), pentaethoxytantalum(Ta(OC$_2$H$_5$)$_5$), trimethoxyboron (B(OCH$_3$)$_3$), triisopropoxyaluminum (Al(OCH(CH$_3$)$_2$)$_3$), tetraethoxysilicon (Si(OC$_2$H$_5$)$_4$), tetraethoxygermanium (Ge(OC$_2$H$_5$)$_4$), tetraethoxytin (Sn(OCH$_3$)$_4$), trimethoxyphosphorus (P(OCH$_3$)$_3$), trimethoxyphosphine oxide (PO(OCH$_3$)$_3$), triethoxyarsenic (As(OC$_2$H$_5$)$_3$) and triethoxyantimony (Sb(OC$_2$H$_5$)$_3$).

Examples of the CVD material in a liquid state at an ordinary temperature other than the foregoing include trimethylaluminum (Al(CH$_3$)$_3$), dimethylaluminum hydride (Al(CH$_3$)$_2$H), triisobutylaluminum (Al(iso-C$_4$H$_9$)$_3$), hex afluoroacetylacetonecopper vinyltrimethylsilane ((CF$_3$CO)$_2$CHCu. CH$_2$CHSi-(CH$_3$)$_3$), hexafluoroacetylacetonecopper allyltrimethylsilane ((CF$_3$CO)$_2$CHCu. CH$_2$CHCH$_2$Si(CH$_3$)$_3$), bis(isopropylcyclopentadienyl) tungsten Dihydride ((iso-C$_3$H$_7$C$_5$H$_5$)$_2$WH$_2$), tetradimethylaminozirconium (Zr(N(CH$_3$)$_2$)$_4$), pentadimethylaminotantulum (Ta(N(CH$_3$)$_2$)$_5$), pentadietbylaminotantulum (Ta(N(C$_2$H$_5$)$_2$)$_5$), tetradimethylaminotitanium (Ti(N(CH$_3$)$_2$)$_4$) and tetradiethylaminotitanium (Ti(N(C$_2$H$_5$)$_2$)$_4$).

Further examples of the CVD material in solid state at an ordinary temperature other than the foregoing include hexacarbonylmolybdenum (Mo(CO)$_6$), dimethylpenthoxygold (Au(CH$_3$)$_2$(OC$_5$H$_7$)), bis(2,2,6,6-tetramethyl-3,5-heptanedionite)barium (Ba((C(CH$_3$)$_3$)$_2$C$_3$HO$_2$)$_2$), bis(2,2,6,6-tetraniethyl-3,5-heptanedionite)strontium (Sr((C(CH$_3$)$_3$)$_2$C$_3$HO$_2$)$_2$), tetra(2,2,6,6-tetramethyl-3,5-heptanedionite)titanium (Ti((C(CH$_3$)$_3$)$_2$C$_3$HO$_2$)$_4$), tetra(2,2,6,6-tetramethyl-3,5-heptanedionite)zirconium (Zr((C(CH$_3$)$_3$)$_2$C$_3$HO$_2$)$_4$), bis(2,2,6,6-tetramethyl-3,5-heptanedionite) lead (Pb((C(CH$_3$)$_3$)$_2$-C$_3$HO$_2$)$_2$), (ditertiallybuthoxybis)(2,2,6,6-tetramethyl-3,5-heptanedionite)-titanium, (diisopropoxy) (2,2,6,6-tetramethyl-3,5-heptanedionite)-titanium, tetrakis(isobutylpivaloylrnethanato)zirconium and (diisopropoxy)(2,2,6,6-tetramethyl-3,5-heptanedionite) zirconium. The above-exemplified materials need, prior to use to be dissolved in an organic solvent in a concentration of usually 0.1 to 1.0 moL/liter, approximately.

The above-mentioned organic solvent to be used as a solvent for a solid CVD-material is that having a boiling point usually ranging from 40° C. to 140° C. Examples of the solvent include such ethers as propyl ether, methylbutyl ether, ethylpropyl ether, ethylbutyl ether, trimethylene oxide, tetrahydrofuran and tetrahydropyran; alcohols such as methyl alcohol, ethyl alcohol, propyl alcohol and butyl alcohol; ketones such as acetone, ethyl methyl ketone, isopropyl methyl ketone and isobutyl methyl ketone; amines such as propylamine, butylamine, diethylamine, dipropylamine and triethylamine; esters such as ethyl acetate, propyl acetate and butyl acetate; and hydrocarbons such as hexane, heptane and octane.

In the following, detailed description will be given of the vaporizing and supplying method according to the present invention with reference to FIG. 1, which however shall never limit the present invention thereto.

FIG. 1 is a constitutional view showing one example of a vaporizing and supplying system to carry out the vaporizing and supplying method according to the present invention, in which use is made as illustrated therein, of a liquid CVD material vessel 2 enclosing a liquid CVD material 1, a plurality of liquid flow rate controllers, for instance, including a liquid flow rate controller for large capacity 4 and a liquid flow rate controller for small capacity 5, a vaporizer 6, a semiconductor manufacturing apparatus 9, and preferably a degassing unit 3. Therein, the plurality of liquid flow rate controllers are installed in parallel so as to enable the same to be used alone, or in plurality at the same time, or switchingly one after another. In FIG. 1, the symbol 7 is gas flow rate controller, the symbol 8 is carrier gas supply line, and the symbols 10 to 12 are gas preheter, inert gas supply line and heat insulation material, respectively.

As a liquid flow rate controller to be used in the vaporizing and supplying method according to the present invention, there is usually used a liquid mass flow controller or a micropump. In the case of applying a liquid mass flow controller, the constitution is such that the liquid CVD material is introduced into the liquid mass flow controller by pressurizing the inside of the liquid CVD material vessel with an inert gas. In the case of applying a micropump, there is usually used a twin or multiple type anticorrosive bellows pump or the like for the purpose of supplying the liquid CVD material without pulsation flow. A non-return valve may be placed on the secondary side of the micropunip so as to enable the flow rate control to be accurate even in the case where the vaporizer is operated at reduced pressure. It is possible in the present invention to use both the liquid mass flow controller and micropump each as a liquid flow rate controller by arranging in parallel, however, the use of the same type liquid flow rate controllers is preferable, and the use of the liquid mass flow controllers only is even more preferable.

There is no specific limitation put on the supply capacity of a liquid flow rate controller which is used in the vaporizing and supplying method according to the present invention, however, there is usually used a liquid flow rate controller having a maximum controllable flow rate within the range of 0.01 to 100 cc/mm. With regard to the performance of the liquid flow rate controller, a minimum controllable flow rate is generally 1 to 5% approximately of the maximum flow rate, and an accuracy of flow rate is generally ±1% approximately of the maximum flow rate in the case of the liquid mass flow controller. Likewise, there is no specific limitation put on the number of the liquid flow rate controllers that are used in the vaporizing and supplying method according to the present invention, however the number of the liquid flow rate controllers is usually two or three.

As a plurality of liquid flow rate controllers to be used in the vaporizing and supplying method according to the present invention, it is possible to use the controllers having the same controllable range of flow rate. However it is preferable to use controllers each having a controllable range of flow rate different from one another in view of the capability of easily and accurately supplying the vaporizer with the liquid CVD material, vaporizing the material in a wide range of capacity including a small to large capacity, and subsequently supplying a semiconductor manufacturing apparatus with the vaporized material. In the case of using liquid flow rate controllers each having a controllable range of flow rate different from one another, the ratio of the maximum controllable flow rate for a controller to the maximum controllable flow rate for a controller having a controllable range of flow rate next to that of the aforesaid controller is usually so selected as to be 1:0.01 to 0.5. For instance, in the case where three liquid flow rate controllers are installed in parallel, the selection is such that the maximum controllable flow rate for a controller having medium capacity is 1 to 50% of the maximum controllable flow rate for a controller having large capacity, and the maximum controllable flow rate for a controller having small capacity is 1 to 50% of the maximum controllable flow rate for a controller having medium capacity (hereinafter, liquid flow rate controllers are classified, according to the maximum controllable flow rate, into a liquid flow rate controller having large capacity, a liquid flow rate controller having medium capacity and a liquid flow rate controller having small capacity).

In the vaporizing and supplying method according to the present invention, the liquid flow rate controllers are put into service in such a manner, for instance, that a liquid flow rate controller having a large capacity in controllable range of flow rate is switched over in turn to a liquid flow rate controller having small capacity so that the liquid CVD material is fed to the vaporizer. By continuously measuring a semiconductor film thickness and controlling the flow rate of the liquid CVD material in a semiconductor manufacturing apparatus in addition to the foregoing procedure, it is made possible to manufacture a semiconductor thin film in an extremely high accuracy of film thickness. Consequently, it is made possible to manufacture a semiconductor with a superior quality.

Besides the aforesaid switching procedure in the vaporizing and supplying method according to the present invention, the liquid flow rate controllers are put into service in such a manner that the liquid CVD material is fed to the vaporizer, while the flow rate thereof is slightly varied by repeatedly altering the single use of the a liquid flow rate controller having large capacity to the simultaneous use of both the controller having large capacity and the controller having small capacity or vice versa. In the case of using the liquid flow rate controllers in the above-mentioned manner, CVD material-containing gas in which the concentration of the material varies slightly is fed from the vaporizer. Accordingly, by supplying the vaporized gas just mentioned above to a continuous film-forming unit as described, for instance, in Japanese Patent Application Laid-Open No. 279457/2001 (Heisei 13), it is made possible to manufacture a semiconductor thin film wherein the film thickness is slightly varied across the supplying direction of a substrate.

The vaporizer to be used in the supplying method according to the present invention should be a vaporizer that is capable of supplying the CVD material which has been subjected to liquid flow rate control in high accuracy by means of the aforesaid liquid flow rate controllers to a semiconductor manufacturing apparatus at a desirable concentration and flow rate with an extremely high vaporization efficiency. Such a vaporizer is exemplified by a vaporizer in which the shape of a vaporization vessel is made to be a sphere, ellipsoid, barrel, cylinder with rounded ends, cone, truncated cone or hemisphere, and which is designed so that a carrier gas forms a swirling flow in the vaporization vessel {Japanese Patent Application Laid-Open No. 342328/1999 (Heisci 11)}; a vaporizer in which at least part of CVD material feed portion in contact with the CVD material is constituted of a corrosion resistant synthetic resin such as fluorinebased resin and polyimide based resin {Japanese Patent Application Laid-Open No. 349840/2001 (Heisei 13)}; and similar vaporizers.

In the vaporizing and supplying method according to the present invention, it is preferable to set up a degassing unit capable of removing an inert gas dissolved in the liquid CVD material between the liquid CVD material vessel and the liquid flow rate controllers in order to measure the amount of the liquid CVD with an extremely high accuracy. Such a degassing unit is exemplified by a degassing unit which performs a degassing function by passing a liquid material in which a first inert gas is dissolved through the inside of a gas-permeable synthetic resin tube, and at the same time, passing a second inert gas having gas permeability for the synthetic resin tube lower than that of the first inert gas along the outside of the tube so as to suppress the permeation of the second inert gas into the inside of the synthetic resin tube, and thus allowing the first inert gas to permeate the synthetic resin tube to enter the outside of the tube {Japanese Patent Application Laid-Open No. 164369/2001 (Heisei 13)}.

In summarizing the working effect of the present invention, it has been made possible to manufacture a semiconductor thin film in an extremely high accuracy of film thickness by controlling the flow rate of the liquid CVD material with an extremely high accuracy, vaporizing the liquid CVD material, supplying a semiconductor manufacturing apparatus with the resultant vaporized material. Consequently, it has been made possible to enhance the step coverage properties, and at the same time to shorten the lithography step during film formation in LCD plat panel.

In the following, the present invention will be described in more detail with reference to comparative examples and working examples, which however shall never limit the present invention thereto.

EXAMPLE 1

<Manufacture of Vaporizing and Supplying System>

A vaporizing and supplying system as illustrated on FIG. 1 was prepared by the use of a liquid CVD material vessel in which tetraisopropoxytitanium had been enclosed, a degassing unit, a liquid mass flow controller having large capacity, a liquid mass flow controller having small capacity, a vaporizer and a semiconductor manufacturing apparatus fitted with a Si substrate. The liquid flow rate controller having large capacity was a liquid mass flow controller (manufactured by Lintec Co., Ltd.) having a maximum controllable flow rate of 2.0 g/min and an accuracy of flow rate of ±1.0%, and the liquid flow rate controller having small capacity was a liquid mass flow controller (manufactured by Lintec Co., Ltd.) having a maximum controllable flow rate of 0.1 g/min and an accuracy of flow rate of ±1.0%. There was used a cylindrical vaporizer which had an internal volume of approximately 190 cc, which was equipped with a protrusion fixed to the bottom thereof and fitted with a heating means in the central portion thereof, and in which a liquid CVD material feed portion in contact with a liquid CVD material was constituted of a fluorine based synthetic resin.

<Vaporizing and Supplying Test>

By the use of the above-prepared vaporizing and supplying system, the following vaporizing and supplying test was carried out to deposit on a Si substrate, a $TiO_2$ thin film aiming at a film thickness of 2000 Å.

Specifically, the inside of the vaporizer was maintained at atmospheric pressure and at a temperature of 190° C., while the inside of the semiconductor manufacturing apparatus was maintained at atmospheric pressure and a temperature of 700° C. Subsequently, tetraisopropoxytitanium as a liquid CVD material was fed to the vaporizer at a flow rate of 2.0 g/min by means of the liquid mass flow controller having large capacity and at the same time, argon gas heated to 190° C. was fed from a carrier gas feed line to the vaporizer at a flow rate of 20 liter/mm, so that the liquid CVD material was vaporized in the vaporizer. Further, argon gas and oxygen gas each heated to 190° C. were added to the vaporized CVD material at an immediately upstream portion of the semiconductor manufacturing apparatus at flow rates of 40 liter/mm and 5 liter/mm, respectively, so that the vaporized CVD material and the gases were fed to the semiconductor manufacturing apparatus.

At the point of time when the film thickness of the $TiO_2$ thin film which had been measured with a film thickness measuring instrument arranged in the semiconductor manufacturing apparatus became 1900 Å, the liquid flow rate controller was switched over from the liquid mass flow controller having large capacity to the liquid mass flow controller having small capacity and at the same time, the flow rate of the tetraisopropoxytitanium was altered to 0.1 g/min. Further at the point of time when the film thickness of the $TiO_2$ thin film became 1990 Å, the flow rate of the tetraisopropoxytitanium was altered to 0.01 g/min. Immediately prior to the point of time when the film thickness became 2000 Å, feed of the vaporized material to the semiconductor manufacturing apparatus was discontinued.

The above-mentioned vaporizing and supplying test was put into practice five times repeatedly. The film thickness of the $TiO_2$ thin film obtained per each time in the foregoing manner is given in Table 1.

EXAMPLE 2

By the use of the vaporizing and supplying system same as in Example 1, the following vaporizing and supplying test was carried out to deposit on a Si substrate, a $SiO_2$ thin film aiming at a film thickness of 2000 Å.

Specifically, the inside of the vaporizer was maintained at atmospheric pressure and a temperature of 160° C., while the inside of the semiconductor manufacturing apparatus was maintained at atmospheric pressure and a temperature of 500° C. Subsequently, tetraethoxysilicon as a liquid CVD material was fed to the vaporizer at a flow rate of 2.0 g/min by means of the liquid mass flow controller having a large capacity and at the same time, nitrogen gas heated to 160° C. was fed from a carrier gas feed line to the vaporizer at a flow rate of 20 liter/mm, so that the liquid CVD material was vaporized in the vaporizer. Further, nitrogen gas and oxygen gas each heated to 160° C. were added to the vaporized CVD material at an immediately upstream portion of the semiconductor manufacturing apparatus at flow rates of 40 liter/mm and 5 liter/mm, respectively, so that the vaporized CVD material and the gases were fed to the semiconductor manufacturing apparatus.

At the point of time when the film thickness of the $SiO_2$ thin film which had been measured with a film thickness measuring instrument arranged in the semiconductor manufacturing apparatus became 1900 Å, the liquid flow rate controller was switched over from the liquid mass flow controller having large capacity to the liquid mass flow controller having small capacity and at the same time, the flow rate of the tetraethoxysilicon was altered to 0.1 g/min. Further at the point of time when the film thickness of the $SiO_2$ thin film became 1990 Å, the flow rate thereof was altered to 0.01 g/min. Immediately prior to the point of time when the film thickness became 2000 Å, feed of the vaporized material to the semiconductor manufacturing apparatus was discontinued.

The above-mentioned vaporizing and supplying test was put into practice five times repeatedly. The film thickness of the $SiO_2$ thin film obtained per each time in the foregoing manner is given in Table 1.

EXAMPLE 3

By the use of the vaporizing and supplying system same as in Example 1, the following vaporizing and supplying test was carried out to deposit on a Si substrate, a $SiO_2$ thin film aiming at a film thickness of 2000 Å.

Specifically, the inside of the vaporizer was maintained at atmospheric pressure and a temperature of 160° C., while the inside of the semiconductor manufacturing apparatus was maintained at atmospheric pressure and a temperature of 500° C. Subsequently, tetramethoxysilicon as a liquid CVD material was fed to the vaporizer at a flow rate of 2.0 g/min by means of the liquid mass flow controller having large capacity and at the same time, nitrogen gas heated to 160° C. was fed from a carrier gas feed line to the vaporizer at a flow rate of 20 liter/min, so that the liquid CVD material was vaporized in the vaporizer. Further, nitrogen gas and oxygen gas each heated to 160° C. were added to the vaporized CVD material at an immediately upstream portion of the semiconductor manufacturing apparatus at flow rates of 40 liter/min and 5 liter/min, respectively, so that the vaporized CVD material and the gases were fed to the semiconductor manufacturing apparatus.

At the point of time when the film thickness of the $SiO_2$ thin film which had been measured with a film thickness measuring instrument arranged in the semiconductor manufacturing apparatus became 1900 Å, the liquid flow rate controller was switched over from the liquid mass flow controller having large capacity to the liquid mass flow controller having small capacity and at the same time, the flow rate of the tetraethoxysilicon was altered to 0.1 g/min. Further at the point of time when the film thickness of the $SiO_2$ thin film became 1990 Å, the flow rate thereof was altered to 0.01 g/min. Immediately prior to the point of time when the film thickness became 2000 Å, feed of the vaporized material to the semiconductor manufacturing apparatus was discontinued.

The above-mentioned vaporizing and supplying test was carried out five times repeatedly. The film thickness of the $SiO_2$ thin film thus obtained per each time is given in Table 1.

EXAMPLE 4

By the use of the vaporizing and supplying system same as in Example 1, the following vaporizing and supplying test was carried out to deposit on a Si substrate, a $Ta_2O_5$ thin film aiming at a film thickness of 1000 Å.

Specifically, the inside of the vaporizer was maintained at atmospheric pressure and a temperature of 190° C., while the inside of the semiconductor manufacturing apparatus was maintained at atmospheric pressure and a temperature of 500° C. Subsequently, pentaethoxytantalum as a liquid CVD material was fed to the vaporizer at a flow rate of 2.0 g/min by means of the liquid mass flow controller having large capacity and at the same time, argon gas heated to 190° C. was fed from a carrier gas feed line to the vaporizer at a flow rate of 20 liter/min, so that the liquid CVD material was vaporized in the vaporizer. Further, argon gas and oxygen gas each heated to 190° C. were added to the vaporized CVD material at an immediately upstream portion of the semiconductor manufacturing apparatus at flow rates of 40 liter/min and 5 liter/min, respectively, so that the vaporized CVD material and the gases were fed to the semiconductor manufacturing apparatus.

At the point of time when the film thickness of the $Ta_2O_5$ thin film which had been measured with a film thickness measuring instrument arranged in the semiconductor manufacturing apparatus became 950 Å, the liquid flow rate controller was switched over from the liquid mass flow controller having large capacity to the liquid mass flow controller having small capacity and at the same time, the flow rate thereof was altered to 0.1 g/min. Further at the point of time when the film thickness of the $Ta_2O_5$ thin film became 995 Å, the flow rate thereof was altered to 0.01 g/min. Immediately prior to the point of time when the film thickness became 1000 Å, feed of the vaporized material to the semiconductor manufacturing apparatus was discontinued.

The above-mentioned vaporizing and supplying test was carried out five times repeatedly. The film thickness of the $Ta_2O_5$ thin film thus obtained per each time is given in Table 1.

Comparative Example 1

In the same manner as in Example 1, a vaporizing and supplying system was prepared except that the installation of a liquid mass flow controller having small capacity was omitted.

By the use of the above-prepared vaporizing and supplying system, the following vaporizing and supplying test was carried out to deposit on a Si substrate, a $TiO_2$ thin film aiming at a film thickness of 2000 Å.

Specifically, the inside of the vaporizer was maintained at atmospheric pressure and a temperature of 190° C., while the inside of the semiconductor manufacturing apparatus was maintained at atmospheric pressure and a temperature of 700° C. Subsequently, tetraisopropoxytitanium as a liquid CVD material was fed to the vaporizer at a flow rate of 2.0 g/min by means of the liquid mass flow controller having large capacity and at the same time, argon gas heated to 190° C. was fed from a carrier gas feed line to the vaporizer at a flow rate of 20 liter/min, so that the liquid CVD material was vaporized in the vaporizer. Further, argon gas and oxygen gas each heated to 190° C. were added to the vaporized CVD material at an immediately upstream portion of the semiconductor manufacturing apparatus at flow rates of 40 liter/min and 5 liter/min, respectively, so that the vaporized CVD material and the gases were fed to the semiconductor manufacturing apparatus.

At the point of time when the film thickness of $TiO_2$ thin film which had been measured with a film thickness measuring instrument arranged in the semiconductor manufacturing apparatus became 1900 Å, the flow rate thereof was altered to 0.2 g/min. Immediately prior to the point of time when the film thickness became 2000 Å, feed of the vaporized material to the semiconductor manufacturing apparatus was discontinued.

The above-mentioned vaporizing and supplying test was carried out five times repeatedly. The film thickness of the $TiO_2$ thin film thus obtained per each time is given in Table 1.

Comparative Example 2

By the use of the vaporizing and supplying system same as in Comparative Example 1, the following vaporizing and supplying test was carried out to deposit on a Si substrate, a $SiO_2$ thin film aiming at a film thickness of 2000 Å.

Specifically, the inside of the vaporizer was maintained at atmospheric pressure and a temperature of 160° C., while the inside of the semiconductor manufacturing apparatus was maintained at atmospheric pressure and a temperature of 500° C. Subsequently, tetraethoxysilicon as a liquid CVD material was fed to the vaporizer at a flow rate of 2.0 g/min by means of the liquid mass flow controller having large capacity and at the same time, nitrogen gas heated to 160° C. was fed from a carrier gas feed line to the vaporizer at a flow rate of 20 liter/min, so that the liquid CVD material was vaporized in the vaporizer. Further, nitrogen gas and oxygen gas each heated to 160° C. were added to the vaporized CVD material at an immediately upstream portion of the semiconductor manufacturing apparatus at flow rates of 40 liter/min and 5 liter/min, respectively, so that the vaporized CVD material and the gases were fed to the semiconductor manufacturing apparatus.

At the point of time when the film thickness of the $SiO_2$ thin film which had been measured with a film thickness measuring instrument arranged in the semiconductor manufacturing apparatus became 1900 Å, the flow rate thereof was altered to 0.2 g/min. Immediately prior to the point of time when the film thickness became 2000 Å, feed of the vaporized material to the semiconductor manufacturing apparatus was discontinued.

The above-mentioned vaporizing and supplying test was carried out five times repeatedly. The film thickness of the $SiO_2$ thin film thus obtained per each time is given in Table 1.

EXAMPLE 5

By the use of the vaporizing and supplying system same as in Example 1, the following vaporizing and supplying test was carried out aiming at the obtainment of the gas containing a CVD material having concentration variation of 0.5% from the outlet of the vaporizer by repeatedly altering the single use of the liquid mass flow controller having large capacity to the simultaneous use of both the liquid mass flow controller having large capacity and the liquid mass flow controller having small capacity or vice versa.

The inside of the vaporizer was maintained at atmospheric pressure and a temperature of 190° C., and tetraisopropoxytitanium as a liquid CVD material was fed to the vaporizer at a flow rate of 1.0 g/min by means of the liquid mass flow controller having large capacity and at the same time, argon gas heated to 190° C. was fed from a carrier gas feed line to the vaporizer at a flow rate of 20 liter/min, so that the liquid CVD material was vaporized in the vaporizer. Further, a continuous measurement was made of the concentration of tetraisopropoxytitanium in the vaporized gas exhausted at the outlet of the vaporizer by means of FT-IR (Fourier Transform Infrared spectrophotometry).

Then, after the concentration of tetraisopropoxytitanium in the vaporized gas exhausted at the outlet of the vaporizer was stabilized, by further using the liquid mass flow controller having small capacity along with the liquid mass flow controller having large capacity already in use, tetraisopropoxytitanium was fed to the vaporizer at a flow rate of 1.005 g/min in which the flow rate through the liquid mass flow controller having small capacity was 0.005 g/min, so that the CVD material was vaporized in the vaporizer. Subsequently, after the concentration of tetraisopropoxytitanium in the vaporized gas exhausted at the outlet of the vaporizer was stabilized, the CVD material was vaporized by using only the liquid mass flow controller having large capacity. The above-mentioned vaporizing test was carried out five times repeatedly. The variation in the concentration of tetraisopropoxytitanium exhausted at the outlet of the vaporizer is given in Table 2.

Comparative Example 3

The procedure in Example 5 was repeated to carry out the following vaporizing and supplying test aiming at the obtainment of the gas containing a CVD material having concentration variation of 0.5 % from the outlet of the vaporizer except that use was made only of the liquid mass flow controller having a large capacity without using the controller having small capacity.

However, even in the case where the flow rate setting was altered to a minimum level with the liquid mass flow controller having large capacity, the variation in the concentration of tetraisopropoxytitanium exhausted at the outlet of the vaporizer exceeded 0.6%, when the vaporizing and supplying test was discontinued.

TABLE 1

|  |  | Film thickness (Å) | Variation range of Film thickness (%) |
|---|---|---|---|
| Example 1 | 1st time | 2003 | 0.20 |
|  | 2nd time | 1999 |  |
|  | 3rd time | 2000 |  |
|  | 4th time | 2002 |  |
|  | 5th time | 2001 |  |
| Example 2 | 1st time | 1998 | 0.15 |
|  | 2nd time | 2001 |  |
|  | 3rd time | 2001 |  |
|  | 4th time | 2000 |  |
|  | 5th time | 2001 |  |
| Example 3 | 1st time | 2001 | 0.30 |
|  | 2nd time | 2004 |  |
|  | 3rd time | 1998 |  |
|  | 4th time | 2001 |  |
|  | 5th time | 1998 |  |
| Example 4 | 1st time | 999 | 0.40 |
|  | 2nd time | 1000 |  |
|  | 3rd time | 998 |  |
|  | 4th time | 1002 |  |
|  | 5th time | 1000 |  |
| Comparative Example 1 | 1st time | 2024 | 1.69 |
|  | 2nd time | 1995 |  |
|  | 3rd time | 2008 |  |
|  | 4th time | 1990 |  |
|  | 5th time | 2015 |  |
| Comparative Example 2 | 1st time | 1983 | 2.59 |
|  | 2nd time | 2017 |  |
|  | 3rd time | 2035 |  |
|  | 4th time | 2006 |  |
|  | 5th time | 1993 |  |

{Remarks}
Variation range of film thickness (%) = (maximum value − minimum value)/average value

TABLE 2

(Example 5)

| Flow rate set 1.00 g/min | | | Flow rate set 1.005 g/min | | | |
|---|---|---|---|---|---|---|
|  | Conc (mg/liter) | variation range of conc (%) |  | Conc (mg/liter) | variation range of conc (%) | Conc. variation (%) |
| 1st time | 49.88 | 0.08 | 1st time | 50.14 | 0.06 | 0.52 |
| 2nd time | 49.91 |  | 2nd time | 50.16 |  | 0.50 |
| 3rd time | 49.89 |  | 3rd time | 50.13 |  | 0.48 |
| 4th time | 49.87 |  | 4th time | 50.13 |  | 0.52 |
| 5th time | 49.90 |  | 5th time | 50.15 |  | 0.50 |
| Average | 49.89 |  | Average | 50.14 |  | 0.50 |

What is claimed is:

1. A vaporizing and supplying method utilizing a liquid flow rate controller, a vaporizer, a semiconductor manufacturing apparatus and a plurality of flow rate controllers, which comprises
   subjecting a liquid CVD material to flow rate control with said liquid flow rate controller, supplying said vaporizer with the material, vaporizing the material, and supplying said semiconductor manufacturing apparatus with the vaporized material, which includes installing in parallel a plurality of said liquid flow rate controllers, in parallel, for the liquid CVD material, and supplying said vaporizer with said material at a variable flow rate thereof by at least one of altering a single use of any of the controllers and simultaneously using a plurality of the controllers and switching any of the controllers one after another.

2. The vaporizing and supplying method according to claim 1, wherein the liquid flow rate controllers each comprise a liquid mass flow controller or a micropump.

3. The vaporizing and supplying method according to claim 1, wherein the liquid flow rate controllers each comprise a liquid mass flow controller.

4. The vaporizing and supplying method according to claim 1, wherein the liquid flow rate controllers each comprise a minimum controllable flow rate of from 1 to 5% of the maximum flow rate of the controller, and an accuracy of flow rate ±1% of the maximum flow rate thereof.

5. The vaporizing and supplying method according to claim 1, wherein the plurality of liquid flow rate controllers each have a controllable range of flow rate different from one another.

6. The vaporizing and supplying method according to claim 1, wherein a ratio of maximum controllable flow rate for a first controller to the maximum controllable flow rate for a second controller having a maximum controllable range of flow rate next to that of said first controller is 1:0.01 to 0.5.

7. The vaporizing and supplying method according to claim 1, which comprises supplying the liquid CVD material to the vaporizer, while a liquid flow rate controller having a large capacity in controllable range of flow rate is switched over in turn to a liquid flow rate controller having a smaller capacity in a controllable range of flow rate.

8. The vaporizing and supplying method according to claim 1, which comprises supplying the liquid CVD material to the vaporizer at a flow rate slightly varied by repeatedly altering the single use of the liquid flow rate controller having a large capacity to a simultaneous use of the liquid flow rate controller having a large capacity and the liquid flow rate controller having a small capacity or vice versa.

9. The vaporizing and supplying method according to claim 8, which comprises varying the flow rate 0.5% approximately.

* * * * *